(12) United States Patent
Wan et al.

(10) Patent No.: US 11,271,142 B2
(45) Date of Patent: Mar. 8, 2022

(54) RED LUMINOPHOR, LED DEVICE AND METHOD FOR MAKING THE LED DEVICE

(71) Applicant: APT ELECTRONICS CO. LTD., Guangdong (CN)

(72) Inventors: Chuiming Wan, Guangdong (CN); Zhaoming Zeng, Guangdong (CN); Shuguang Yao, Guangdong (CN); ChiWing Keung, Guangdong (CN); Ru-Shi Liu, Guangdong (CN); Guowei David Xiao, Guangdong (CN)

(73) Assignee: APT ELECTRONICS CO. LTD., Guangdong (CN)

( * ) Notice: Subject to any disclaimer, the term of this patent is extended or adjusted under 35 U.S.C. 154(b) by 0 days.

(21) Appl. No.: 16/934,312

(22) Filed: Jul. 21, 2020

(65) Prior Publication Data
US 2020/0350470 A1 Nov. 5, 2020

Related U.S. Application Data

(63) Continuation of application No. PCT/CN2018/124161, filed on Dec. 27, 2018.

(30) Foreign Application Priority Data

Dec. 6, 2018 (CN) .......................... 201811486520.2

(51) Int. Cl.
*H01L 33/50* (2010.01)
*A01G 7/04* (2006.01)
*H01L 33/56* (2010.01)

(52) U.S. Cl.
CPC ............ *H01L 33/507* (2013.01); *A01G 7/045* (2013.01); *H01L 33/502* (2013.01); *H01L 33/56* (2013.01); *H01L 2933/0041* (2013.01)

(58) Field of Classification Search
CPC ..... H01L 33/507; H01L 33/502; H01L 33/56; H01L 2933/0041; A01G 7/045; Y02P 60/14; C09K 11/0883; C09K 11/7734
See application file for complete search history.

(56) References Cited

U.S. PATENT DOCUMENTS

2015/0159085 A1 6/2015 Izawa et al.
2015/0194412 A1* 7/2015 Omura ................ H01L 25/0753
257/89

(Continued)

FOREIGN PATENT DOCUMENTS

CN 102751420 A 10/2012
CN 103681978 A 3/2014

(Continued)

OTHER PUBLICATIONS

Li, Pengfei , "Exploration, Preparation and Luminescence Properties of Novel Manganese Ions Doped Red Luminescent Materials", Non-official translation: Masters's Theses, Jul. 15, 2018 (Jul. 15, 2018), text, pp. 11 and 12, and table 1-1.

(Continued)

*Primary Examiner* — Jonathan Han
(74) *Attorney, Agent, or Firm* — Robert P. Michal, Esq.; Carter, DeLuca & Farrell LLP

(57) ABSTRACT

A red luminophor, LED device and method for making the LED device. The red luminophor includes one or more materials selected from SrLiAl3N4:Eu2+, CaLiAl3N4:Eu2+, Sr4LiAl11N14:Eu2+ and Li2Ca2(Mg2Si2N6):Eu2+. The LED device includes the red luminophor. The method for making the LED device includes preparing a carrier; installing a blue LED onto the carrier; mixing the red luminophors and the transparent sealant to form a mixture; dispensing the mixture on the blue LED and the carrier to form an integration; and heating and curing the integration. The red luminophor has continuous light radiation in the (Continued)

wavelength range of 600 nm-750 nm, with the emission peak at 650-680 nm and the FWHM of less than 90 nm. Its emission light intensity at the wavelength of 730 nm is not less than 30% of its maximum emission light intensity, which matches the absorption needs of phytochrome of plant.

18 Claims, 2 Drawing Sheets

(56) References Cited

U.S. PATENT DOCUMENTS

| | | | | |
|---|---|---|---|---|
| 2015/0325764 | A1* | 11/2015 | Rantala | H01L 33/642 257/76 |
| 2017/0040501 | A1* | 2/2017 | Choi | H01L 33/502 |
| 2018/0108818 | A1* | 4/2018 | Takehara | H01L 33/58 |
| 2018/0148644 | A1* | 5/2018 | Seibald | C04B 35/6268 |

FOREIGN PATENT DOCUMENTS

| | | |
|---|---|---|
| CN | 106601892 A | 4/2017 |
| CN | 207504011 U | 6/2018 |
| CN | 108493319 A | 9/2018 |
| WO | 2018/087304 A1 | 5/2018 |
| WO | 2018/162375 A2 | 9/2018 |

OTHER PUBLICATIONS

Philipp Strobel et al, "Luminescence of the Narrow-Band Red Emitting Nitridomagnesosilicate Li2(Ca1-xSrx)2 [Mg2Si2N6]:Eu2+ (x=0-0.06)", Chemistry of Materials, Jan. 13, 2017(Jan. 13, 2017), abstract, text, p. 1379 last para.—p. 1381 last para, fig. 4.

Dominik Wilhelm et at, "Narrow-Band Red Emission in the Nitridolithoaluminate Sr4[LiAl11N14]:Eu2+", Chemistry of Materials, Dec. 26, 2016 (Dec. 26, 2016), abstract, text pp. 1-10.

Hu, Weiwei, "Synthesis and Properties of Al Nitride based Phosphors", China Doctoral Dissertations Full-text Database, Sep. 30, 2016 (Sep. 30, 2016), text, p. 81 2nd para.—p. 96 last para.

International Search Report issued by the China National Intellectual Property Administration acting as the International Searching Authority in relation to International Application No. PCT/CN2018/124161 along with English language translation dated Aug. 27, 2019 (8 pages).

Written Opinion of the International Searching Authority issued by the China National Intellectual Property Administration acting as the International Searching Authority in relation to International Application No. PCT/CN2018/124161 dated Aug. 27, 2019 (4 pages).

* cited by examiner

RED LUMINOPHOR, LED DEVICE AND METHOD FOR MAKING THE LED DEVICE

CROSS-REFERENCE TO RELATED APPLICATIONS

This application claims priority to PCT Application No. PCT/CN2018/124161, having a filing date of Dec. 27, 2018, which is based on Chinese Application No. 201811486520.2, having a filing date of Dec. 6, 2018, the entire content of which is hereby incorporated by reference.

FIELD OF TECHNOLOGY

The following relates to a field of LED, in particular, a red luminophor, LED device and method for making the LED device.

BACKGROUND

Phytochromes in plants are sensitive to red light and far-red light, which contribute the plant's ability to germinate, such that the timing of flowering in plants can be regulated by adjusting the wavelength of red light in order to artificially control the breeding of plants. LED red light semiconductor chip is an important component of plant-lighting LED device, and is made from quaternary compound of AlInGaP system. The wavelength of red light emitted by the LED red light semiconductor chip can be adjusted to 660 nm and 730 nm for the sake of plant's absorption, facilitating the growth of plant. The LED red light semiconductor chip is a photoelectric device packaging encapsulated by conductive silver adhesives, gold thread and transparent sealant, etc. As the manufacture process for such LED red light semiconductor chip is complicated and costly, the LED red light semiconductor chip is typically replaced by a combination of blue LED chip and red phosphors. Blue LED chip features more advantages, for example, mature manufacture process, low manufacture cost, great thermal stability, slight color drift and excellent compatibility, whereas the existing red phosphors are mainly selected from nitride—red phosphors, and feature some disadvantages, for example, large half-peak width, more energy loss in the long-wave range where the wavelength is more than 670 nm, low optical radiation power and mismatch between its maximum emission light intensity and the absorption of phytochrome of plant. Therefore, in general, the combination of the blue LED chip and the red phosphors features low irradiation efficiency and low plant absorption rate for red light.

SUMMARY OF INVENTION

Therefore, An aspect relates to a red luminary to alleviate the current problems, for example, high cost to make the LED red light semiconductor chip, and nitride red phosphor having more energy loss in the long-wave range, low optical radiation power and the mismatch between its maximum emission light intensity and the absorption needs of phytochrome of plant.

Provided is a red luminophor, comprising one or more materials selected from $SrLiAl_3N_4:Eu^{2+}$, $CaLiAl_3N_4:Eu^{2+}$, $Sr_4LiAl_{11}Ni_4:Eu^{2+}$ and $Li_2Ca_2(Mg_2Si_2N_6):Eu^{2+}$.

In the luminophor, rare earth luminescent ions $Eu^{2+}$ enter the crystal lattice of the inorganic compound. $Eu^{2+}$ will have a 5d-4f transition after excitation from external light, then optical radiation occurs, and red light is generated. The red luminophor has continuous light radiation in the wavelength range of 600 nm-750 nm, with the emission peak located at 650 nm-680 nm and the FWHM of less than 90 nm, which facilities the absorption of plants at light wavelength of 660 nm. Its emission light intensity at the wavelength of 730 nm is not less than 30% of its maximum emission light intensity, which facilities the absorption of phytochrome in plants at light wavelength of 730 nm, and matches the absorption needs of phytochrome of plant. It has the advantages of less energy loss in the long-wave range and higher optical radiation power.

Provided is a LED device comprising the above-mentioned red luminophor.

The LED device includes one or more red luminophors that comprising one or more materials selected from $SrLiAl_3N_4:Eu^{2+}$, $CaLiAl_3N_4:Eu^{2+}$, $Sr_4LiAl_{11}N_{14}:Eu^{2+}$ and $Li_2Ca_2(Mg_2Si_2N_6):Eu^{2+}$. It has continuous light radiation in the wavelength range of 600 nm-750 nm, and the peak of emission light intensity in the wavelength range of 650 nm-680 nm as well as the FWHM of less than 90 nm, which facilities the absorption of plants at light wavelength of 660 nm. Its emission light intensity at the wavelength of 730 nm is not less than 30% of its maximum emission light intensity, which facilities the absorption of phytochrome in plants at light wavelength of 730 nm, and matches the absorption needs of phytochrome of plant. It has the advantages of less energy loss in the long-wave range and higher optical radiation power. The LED device of the present invention not only achieves the same effect as the red light LED semiconductor chip, but also reduces manufacture cost and has higher irradiation efficiency compared to the combination of the blue LED chip and the existing red phosphor.

In an embodiment, the LED device comprises a carrier, a blue LED, the red luminophors, a transparent sealant, and an electrical connection lead; the red luminophors are dispersed in the transparent sealant, the transparent sealant covers the blue LED and the electrical connection lead connects the blue LED and the carrier. The blue light emitted by the blue LED can be absorbed by the red luminophors, and then the red luminophors emit red light in wavelength of 600 nm-750 nm, which is used in plant lighting and can be absorbed by the plant to facilitate the growth of the plant.

In a further embodiment, the carrier is a metal substrate carrier or a ceramic substrate carrier.

In a further embodiment, the metal substrate carrier is a metal substrate plastic-encapsulatedly leaded carrier and/or a metal substrate leadless carrier.

In a further embodiment, the blue LED is a semiconductor LED containing group III-VI elements, and the wavelength of light emitted by the blue LED ranges from 400 nm to 460 nm.

In a further embodiment, the transparent sealant is one or more materials selected from organic silicone, epoxy resin and acrylic resin.

In a further embodiment, the electrical connection lead is one or more wires selected from gold wire, silver wire and copper wire.

Provided is a method for making the above-mentioned LED device, the method comprises following steps:

Step 1: preparing a carrier;
Step 2: installing a blue LED onto the carrier;
Step 3: mixing the red luminophors and the transparent sealant to form a mixture;
Step 4: dispensing the mixture on the blue LED and the carrier to form an integration; and
Step 5: heating and curing the integration.

In the method, the conventional red light LED semiconductor chip is replaced with the red luminophors, which shorten the period of manufacturing LED chips, simplifies the process and reduces the cost. The red luminophor used in the method comprises one or more materials selected from $SrLiAl_3N_4:Eu^{2+}$, $CaLiAl_3N_4:Eu^{2+}$, $Sr_4LiAl_{11}N_{14}:Eu^{2+}$ and $Li_2Ca_2(Mg_2Si_2N_6):Eu^{2+}$. The LED chips has continuous light radiation in the wavelength range of 600 nm-750 nm, with the emission peak located at 650 nm-680 nm and the FWHM of less than 90 nm, which facilities the absorption of plants at light wavelength of 660 nm. Its emission light intensity at the wavelength of 730 nm is not less than 30% of its maximum emission light intensity, which facilities the absorption of phytochrome in plants at light wavelength of 730 nm, and matches the absorption needs of phytochrome of plant. It has the advantages of less energy loss in the long-wave range and higher optical radiation power.

Comparing to the prior art, the advantage of the present invention is as follows:

The red luminophor of the present invention has continuous light radiation in the wavelength range of 600 nm-750 nm, with the emission peak located at 650 nm-680 nm and the FWHM of less than 90 nm, which facilities the absorption of plants at light wavelength of 660 nm. Its emission light intensity at the wavelength of 730 nm is not less than 30% of its maximum emission light intensity, which facilities the absorption of phytochrome in plants at light wavelength of 730 nm, and matches the absorption needs of phytochrome of plant. It has the advantages of less energy loss in the long-wave range and higher optical radiation power.

The LED device of the present invention includes one or more red luminophors that comprise one or more materials selected from $SrLiAl_3N_4:Eu^{2+}$, $CaLiAl_3N_4:Eu^{2+}$, $Sr_4LiAl_{11}N_{14}:Eu^{2+}$ and $Li_2Ca_2(Mg_2Si_2N_6):Eu^{2+}$. It has continuous light radiation in the wavelength range of 600 nm-750 nm, with the emission peak located at 650 nm-680 nm and the FWHM of less than 90 nm, which facilities the absorption of plants at light wavelength of 660 nm. Its emission light intensity at the wavelength of 730 nm is not less than 30% of its maximum emission light intensity, which facilities the absorption of phytochrome in plants at light wavelength of 730 nm, and matches the absorption needs of phytochrome of plant. It has the advantages of less energy loss in the long-wave range and higher optical radiation power. The LED device of the present invention not only achieves the same effect as the red light LED semiconductor chip, but also reduces manufacture cost and has higher irradiation efficiency compared to the combination of the blue LED chip and the existing red phosphors.

The method for making the LED device of the present invention uses the red luminophors to replace the red light LED semiconductor chip in prior art, and shortens the period of manufacturing LED chips, simplifies the process and reduces the cost. The red luminophor used in the method comprises one or more materials selected from $SrLiAl_3N_4:Eu^{2+}$, $CaLiAl_3N_4:Eu^{2+}$, $Sr_4LiAl_{11}N_{14}:Eu^{2+}$ and $Li_2Ca_2(Mg_2Si_2N_6):Eu^{2+}$. The LED device has continuous light radiation in the wavelength range of 600 nm-750 nm, with the emission peak located at 650 nm-680 nm and the FWHM of less than 90 nm, which facilities the absorption of plants at light wavelength of 660 nm. Its emission light intensity at the wavelength of 730 nm is not less than 30% of its maximum emission light intensity, which facilities the absorption of phytochrome in plants at light wavelength of 730 nm, and matches the absorption needs of phytochrome of plant. It has the advantages of less energy loss in the long-wave range and higher optical radiation power.

BRIEF DESCRIPTION OF DRAWINGS

Some of the embodiments will be described in detail, with reference to the following figures, wherein like designations denote like members, wherein.

Figure 1:
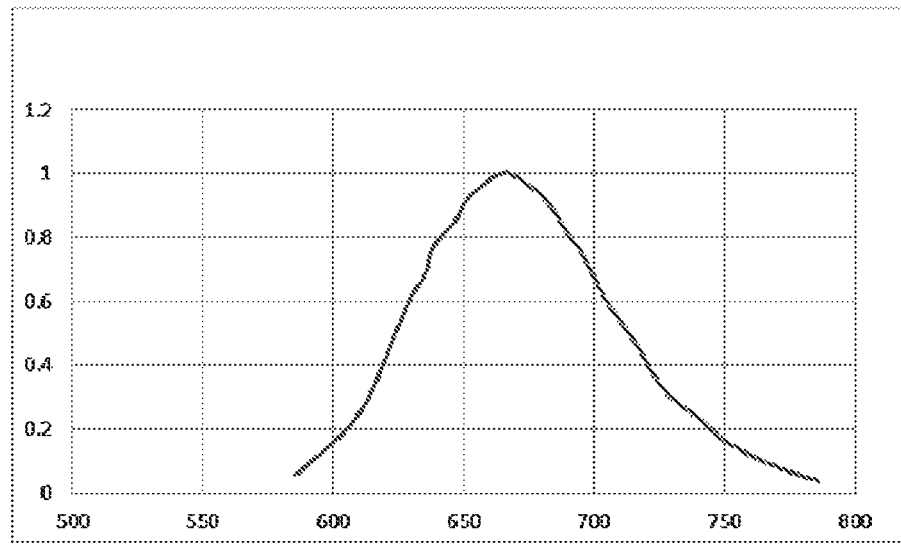
FIG. 1 is a photoluminescence spectrogram of a red luminophors in accordance with Embodiment 1 of the present invention.

LIST OF REFERENCE CHARACTERS 1 carrier
2 blue light emitting diode (blue LED)
3 red luminophors
4 transparent sealant
5 reflector cup

DETAILED DESCRIPTION

The present invention will be described hereinafter with reference to the figures and the embodiments for the sake of better understanding. The figures show preferred embodiments of the present invention. However, the present invention can be implemented in many different forms and is not limited to the embodiments described in this disclosure. These embodiments are provided only for a thorough understanding of the present invention.

Unless otherwise specified, all technical and scientific terms used herein have the same meaning as commonly understood by those skilled in the technical field of the present invention. The terminology used in the present invention is for the purpose of describing specific embodiments, and is not intended to limit the present invention.

The red luminophor of the present invention was made by the following steps, that is, mixing the materials of $Li_3N$, $Sr_3N_2$, EuN, AlN and $Ca_3N_2$ in respective ratio, putting it in a boron nitride crucible, and calcining it in a high temperature and pressure furnace at 1000° C. and 1000 Mpa, with nitrogen containing 5% hydrogen, for 4 hours long, then cooling the furnace to room temperature. Such the mixed materials become red luminophor.

Embodiment 1

Figure 4:
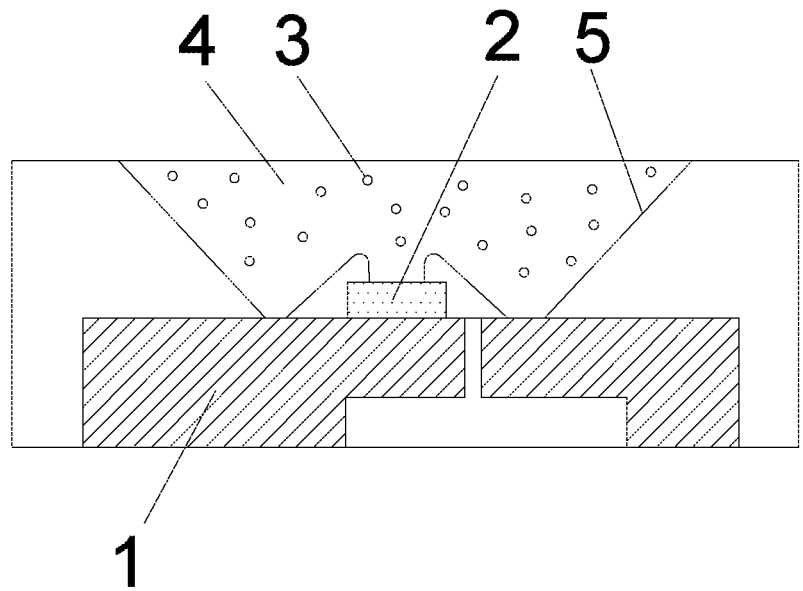
FIG. 4 is a structurally schematic view of a LED device in accordance with embodiments of the present invention.

As shown in FIG. 4, a LED device includes a carrier 1, a blue LED 2, red luminophors 3, a transparent sealant 4 and electrical connection lead. The red luminophors 3 are dispersed in the transparent sealant 4, and the transparent sealant 4 covers the blue LED 2. The electrical connection lead connects the blue LED 2 and the carrier 1. Wherein, the carrier 1 is a ceramic substrate, the red luminophors 3 are a combination of $SrLiAl_3N_4:Eu^{2+}$ and $CaLiAl_3N_4:Eu^{2+}$, the transparent sealant 4 is epoxy resin, and the electrical connection lead is copper wire.

Embodiment 2

As shown in FIG. 4, a LED device includes a carrier 1, a blue LED 2, red luminophors 3, a transparent sealant 4 and electrical connection lead. The red luminophors 3 are dispersed in the transparent sealant 4, and the transparent sealant 4 covers the blue LED 2. The electrical connection lead connects the blue LED 2 and the carrier 1. Wherein, the carrier 1 is a metal substrate without any leads, the red luminophors 3 are a combination of $SrLiAl_3N_4:Eu^{2+}$ and $Sr_4LiAl_{11}N_{14}:Eu^{2+}$, the transparent sealant 4 is acrylic resin, and the electrical connection lead is silver wire.

Embodiment 3

As shown in FIG. 4, a LED device includes a carrier 1, a blue LED 2, red luminophors 3, a transparent sealant 4, and electrical connection lead. The red luminophors 3 are dispersed in the transparent sealant 4, and the transparent sealant 4 covers the blue LED 2. The electrical connection lead connects the blue LED 2 and the carrier 1. Wherein, the carrier 1 is a metal substrate without any leads, the red luminophors 3 are a combination of $Sr_4LiAl_{11}N_{14}:Eu^{2+}$ and $Li_2Ca_2(Mg_2Si_2N_6):Eu^{2+}$, the transparent sealant 4 is acrylic resin, the electrical connection lead is copper wire.

Embodiment 4

A method for making a LED device, including following steps:

Step 1: Preparing a carrier;

Step 2: Installing a blue LED on the carrier;

Step 3: Mixing red luminophors and a transparent sealant to form a mixture, wherein the red luminophors are the combination of $SrLiAl_3N_4:Eu^{2+}$ and $Sr_4LiAl_{11}N_{14}:Eu^{2+}$;

Step 4: Dispensing the mixture on the blue LED and the carrier to form an integration; and Step 5: Heating and curing the integration.

Experiment

The photoluminescence spectrum at the wavebands of 500 nm-780 nm of the red luminophors in the LED device in accordance with the Embodiments 1-3 is detected by the fluorescence spectrometer, with the excitation of 450 nm. The results are shown in FIGS. 1-3.

As shown in FIG. 1, the red luminophors of Embodiment 1, which are the combination of $SrLiAl_3N_4:Eu^{2+}$ and $CaLiAl_3N_4:Eu^{2+}$, have the emission peak at 667 nm with the Full Width at Half Maximum (FWHM) of 72 nm.

Figure 2:
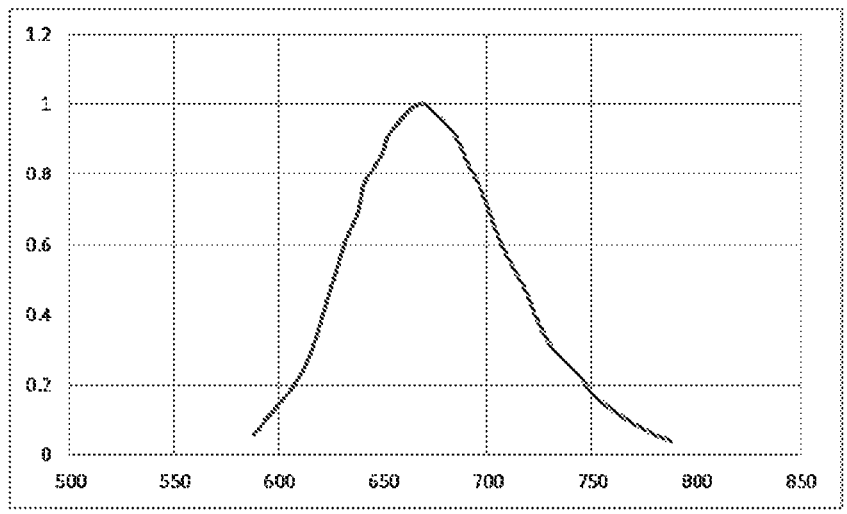
FIG. 2 is a photoluminescence spectrogram of a red luminophors in accordance with Embodiment 2 of the present invention.

As shown in FIG. 2, the red luminophors of Embodiment 2, which are the combination of $SrLiAl_3N_4:Eu^{2+}$ and $Sr_4LiAl_{11}N_{14}:Eu^{2+}$, have the emission peak at 660 nm with the FWHM of 68 nm.

Figure 3:
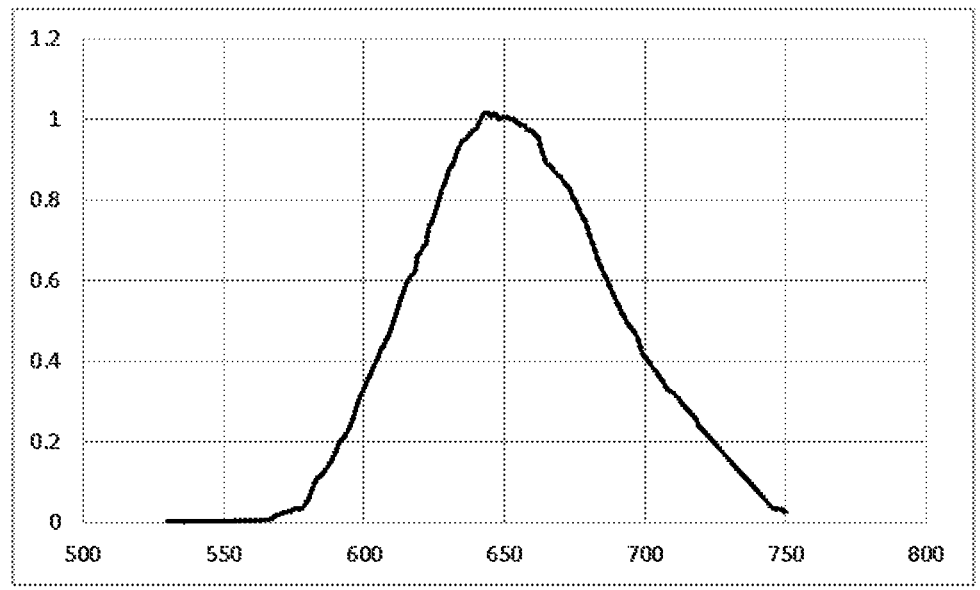
FIG. 3 is a photoluminescence spectrogram of a red luminophors in accordance with Embodiment 3 of the present invention.

As shown in FIG. 3, the red luminophors of Embodiment 3, which are the combination of $Sr_4LiAl_{11}N_{14}:Eu^{2+}$ and $Li_2Ca_2(Mg_2Si_2N_6):Eu^{2+}$, have the emission peak at 660 nm with the FWHM of 80 nm.

The above results show that the red luminophors of the present invention have continuous light radiation in the wavelength range of 600 nm-750 nm, and the peak of emission light intensity in the wavelength range of 650 nm-680 nm as well as the FWHM of less than 90 nm. Its emission light intensity at the wavelength of 730 nm is not less than 30% of its maximum emission light intensity, facilitating the absorption of phytochrome in plants at light wavelength of 660 nm and 730 nm.

The technical features of the above-mentioned embodiments can be re-grouped in any way, and all possible combinations thereof are not described at all here for the sake of conciseness. However, as long as there is no contradiction between the combinations of these technical features, the combinations should be within the scope of this invention.

The embodiment described hereinbefore is merely preferred embodiment of the present invention and not for purposes of any restrictions or limitations on the invention. It will be apparent that any non-substantive, obvious alterations or improvement by the technician of this technical field according to the present invention may be incorporated into ambit of claims of the present invention.

For the sake of clarity, it is to be understood that the use of 'a' or 'an' throughout this application does not exclude a plurality, and 'comprise' or 'comprising' do not exclude other steps or elements.

What is claimed is:

1. A red luminophor, comprising $Sr_4LiAl_{11}N_{14}:Eu^{2+}$ and $Li_2Ca_2(Mg_2Si_2N_6):Eu^{2+}$, wherein the combination of $Sr_4LiAl_{11}N_{14}:Eu^{2+}$ and $Li_2Ca_2(Mg_2Si_2N_6):Eu^{2+}$ have an emission peak at 660 nm with an FWHM of 80 nm, wherein an emission light intensity of the red luminophor at a wavelength of 730 nm is not less than 30% of its maximum emission light intensity.

2. The red luminophor of claim 1, wherein a wavelength of light emitted by the red luminophor ranges from 600 nm to 750 nm, and an emission light intensity of the red luminophor is maximum when the wavelength ranges from 650 nm to 680 nm.

3. A LED device comprising the red luminophor of claim 1.

4. The LED device of claim 3, wherein a wavelength of light emitted by the red luminophor ranges from 600 nm to 750 nm, and an emission light intensity of the red luminophor is maximum when the wavelength ranges from 650 nm to 680 nm.

5. The LED device of claim 3, wherein the LED device comprises a carrier, a blue LED, the red luminophors, a transparent sealant, and an electrical connection lead; the red luminophors are dispersed in the transparent sealant, the transparent sealant covers the blue LED and the electrical connection lead connects the blue LED and the carrier.

6. The LED device of claim 5, wherein the carrier is a metal substrate carrier or a ceramic substrate carrier.

7. The LED device of claim 6, wherein the metal substrate carrier is a metal substrate plastic-encapsulatedly leaded carrier and/or a metal substrate leadless carrier.

8. The LED device of claim 5, wherein the blue LED is a semiconductor LED containing group III-VI elements, and a wavelength of light emitted by the blue LED ranges from 400 nm to 460 nm.

9. The LED device of claim 5, wherein the transparent sealant is one or more materials selected from organic silicone, epoxy resin and acrylic resin.

10. The LED device of claim 5, wherein the electrical connection lead is one or more wires selected from gold wire, silver wire and copper wire.

11. A method for making the LED device of claim 3, comprising following steps:

preparing a carrier;

installing a blue LED onto the carrier;

mixing the red luminophors and a transparent sealant to form a mixture;

dispensing the mixture on the blue LED and the carrier to form an integration; and heating and curing the integration.

12. The method of claim 11, wherein a wavelength of light emitted by the red luminophor ranges from 600 nm to 750 nm, and an emission light intensity of the red luminophor is maximum when the wavelength ranges from 650 nm to 680 nm.

13. The method of claim 11, wherein the LED device comprises a carrier, a blue LED, the red luminophors, a transparent sealant, and an electrical connection lead; the red luminophors are dispersed in the transparent sealant, the transparent sealant covers the blue LED and the electrical connection lead connects the blue LED and the carrier.

14. The method of claim 13, wherein the carrier is a metal substrate carrier or a ceramic substrate carrier.

15. The method of claim 14, wherein the metal substrate carrier is a metal substrate plastic-encapsulatedly leaded carrier and/or a metal substrate leadless carrier.

16. The method of claim 13, wherein the blue LED is a semiconductor LED containing group III-VI elements, and the wavelength of light emitted by the blue LED ranges from 400 nm to 460 nm.

17. The method of claim 13, wherein the transparent sealant is one or more materials selected from organic silicone, epoxy resin and acrylic resin.

18. The method of claim 13, wherein the electrical connection lead is one or more wires selected from gold wire, silver wire and copper wire.

* * * * *